US009025377B2

(12) United States Patent
Yamada et al.

(10) Patent No.: US 9,025,377 B2
(45) Date of Patent: May 5, 2015

(54) METHOD OF OPERATING SEMICONDUCTOR MEMORY DEVICE

(75) Inventors: Kunihiro Yamada, Mie-ken (JP); Hideaki Aochi, Kanagawa-ken (JP); Masaru Kito, Kanagawa-ken (JP); Tomoko Fujiwara, Kanagawa-ken (JP); Yoshiaki Fukuzumi, Kanagawa-ken (JP); Ryouhei Kirisawa, Kanagawa-ken (JP); Yoshimasa Mikajiri, Mie-ken (JP); Kaori Kawasaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1080 days.

(21) Appl. No.: 13/052,195

(22) Filed: Mar. 21, 2011

(65) Prior Publication Data

US 2012/0026775 A1 Feb. 2, 2012

(30) Foreign Application Priority Data

Jul. 29, 2010 (JP) ................................ 2010-170776

(51) Int. Cl.

*G11C 16/22* (2006.01)
*G11C 16/04* (2006.01)
*H01L 27/115* (2006.01)

(52) U.S. Cl.

CPC ............ *G11C 16/0483* (2013.01); *G11C 16/22* (2013.01); *H01L 27/11578* (2013.01); *H01L 27/11582* (2013.01)

(58) Field of Classification Search

USPC ................................ 365/104, 185.04, 185.29
See application file for complete search history.

(56) References Cited

U.S. PATENT DOCUMENTS

| | | | | |
|---|---|---|---|---|
| 7,376,010 | B2 * | 5/2008 | Tanaka et al. | 365/185.04 |
| 8,372,720 | B2 * | 2/2013 | Fukuzumi et al. | 438/287 |
| 8,467,246 | B2 * | 6/2013 | Kim et al. | 365/185.17 |
| 8,559,224 | B2 * | 10/2013 | Han et al. | 365/185.11 |
| 8,634,246 | B2 * | 1/2014 | Kang et al. | 365/185.17 |
| 2008/0298128 | A1 * | 12/2008 | Kang et al. | 365/185.18 |
| 2010/0097858 | A1 | 4/2010 | Tokiwa et al. | |
| 2010/0149870 | A1 | 6/2010 | Shirota | |

FOREIGN PATENT DOCUMENTS

| | | | |
|---|---|---|---|
| JP | 2001-35176 | A | 2/2001 |
| JP | 2008-171839 | | 7/2008 |
| JP | 2009-146954 | | 7/2009 |
| JP | 2010-102755 | A | 5/2010 |
| JP | 2010-134992 | A | 6/2010 |
| WO | WO 2010/002873 | A1 | 1/2010 |

OTHER PUBLICATIONS

Japanese Office Action issued Apr. 18, 2013 in Patent Application No. 2010-170776 with English Translation.

* cited by examiner

*Primary Examiner* — Harry W Byrne
*Assistant Examiner* — Lance Reidlinger
(74) *Attorney, Agent, or Firm* — Oblon, McClelland, Maier & Neustadt, L.L.P.

(57) ABSTRACT

According to one embodiment, a method of operating a semiconductor memory device is disclosed. The method can include storing read-only data in at least one selected from a memory cell of an uppermost layer and a memory cell of a lowermost layer of a plurality of memory cells connected in series via a channel body. The channel body extends upward from a substrate to intersect a plurality of electrode layers stacked on the substrate. The method can include prohibiting a data erase operation of the read-only memory cell having the read-only data stored in the read-only memory cell.

16 Claims, 14 Drawing Sheets

| | PROGRAM DATA TO NORMAL MC | PROGRAM DATA TO $MC_{ROM}$ |
|---|---|---|
| BL | 0V | 0V |
| SGD | Vpass_sg | Vpass_sg |
| WL4D | Vpass | Vpgm |
| WL3D | Vpgm(SELECTED MC)/Vpass(UNSELECTED MC) | Vpass |
| WL2D | Vpgm(SELECTED MC)/Vpass(UNSELECTED MC) | Vpass |
| WL1D | Vpass | Vpass |
| BG | Vpass | Vpass |
| WL1S | Vpass | Vpass |
| WL2S | Vpgm(SELECTED MC)/Vpass(UNSELECTED MC) | Vpass |
| WL3S | Vpgm(SELECTED MC)/Vpass(UNSELECTED MC) | Vpass |
| WL4S | Vpass | Vpass |
| SGS | 0V | 0V |
| SL | 0V | 0V |

| | READ DATA OF NORMAL MC |
|---|---|
| BL | Vbl |
| SGD | Vread_sg |
| WL4D | Vread |
| WL3D | Vrcg(SELECTED MC)/ Vread(UNSELECTED MC) |
| WL2D | Vrcg(SELECTED MC)/ Vread(UNSELECTED MC) |
| WL1D | Vread |
| BG | Vread |
| WL1S | Vread |
| WL2S | Vrcg(SELECTED MC)/ Vread(UNSELECTED MC) |
| WL3S | Vrcg(SELECTED MC)/ Vread(UNSELECTED MC) |
| WL4S | Vread |
| SGS | Vread_sg |
| SL | 0V |

| | READ DATA OF $MC_{ROM}$ | ERASE |
|---|---|---|
| BL | Vbl | Vera |
| SGD | Vread_sg | VeraG |
| WL4D | Vrcg | Vpass |
| WL3D | Vread | 0V |
| WL2D | Vread | 0V |
| WL1D | Vread | Vpass |
| BG | Vread | Vpass_bg |
| WL1S | Vread | Vpass |
| WL2S | Vread | 0V |
| WL3S | Vread | 0V |
| WL4S | Vread | Vpass |
| SGS | Vread_sg | VeraG |
| SL | 0V | Vera |

FIG. 6

61c
BG
Vpass_bg
Vpass
Vread
109
108
107
105
106
read
read_rom
write
write_rom
erase 65
SGunsel
SGDsel, SGSsel
120
VeraG
119
118
Vpass_sg
117
VSS
116
Vread_sg
112
113
114
115
110
111
read
read_rom
write
write_rom
sel_sg
unsel_sg
erase 61a
WL2D,WL3D,WL2S,WL3S
read
sel_wl
unsel_wl
write
read_rom
write_rom
erase
121
122
123
124
125
126
127
128
129
130
131
Vrcg
Vread
Vpgm
Vpass
Vss

METHOD OF OPERATING SEMICONDUCTOR MEMORY DEVICE

CROSS-REFERENCE TO RELATED APPLICATIONS

This application is based upon and claims the benefit of priority from the prior Japanese Patent Application No. 2010-170776, filed on Jul. 29, 2010; the entire contents of which are incorporated herein by reference.

FIELD

Embodiments described herein relate generally to a method of operating a semiconductor device.

BACKGROUND

Technology has been proposed to three-dimensionally arrange memory cells by making memory holes in a stacked body including insulating layers multiply stacked alternately with electrode layers that function as control gates, forming charge storage films on the side walls of the memory holes, and providing silicon inside the memory holes.

In such a structure, the memory cell of the uppermost layer or the lowermost layer is adjacent to a selection transistor or a back gate transistor which has a structure different from those of the memory cells. Therefore, the patterned configurations and the device characteristics of the memory cells of the uppermost layer and the lowermost layer easily differ from those of the other memory cells which may cause fluctuation of the characteristics of the memory cells as an entirety.

BRIEF DESCRIPTION OF THE DRAWINGS

FIG. 6 shows an operating voltage of the semiconductor memory device of the embodiment;

DETAILED DESCRIPTION

In general, according to one embodiment, a method of operating a semiconductor memory device is disclosed. The method can include storing read-only data in at least one selected from a memory cell of an uppermost layer and a memory cell of a lowermost layer of a plurality of memory cells connected in series via a channel body. The channel body extends upward from a substrate to intersect a plurality of electrode layers stacked on the substrate. The method can include prohibiting a data erase operation of the read-only memory cell having the read-only data stored in the read-only memory cell.

Various embodiments will be described hereinafter with reference to the accompanying drawings. Although silicon is illustrated as the semiconductor in the embodiments described below, semiconductors other than silicon may be used.

Figure 1:
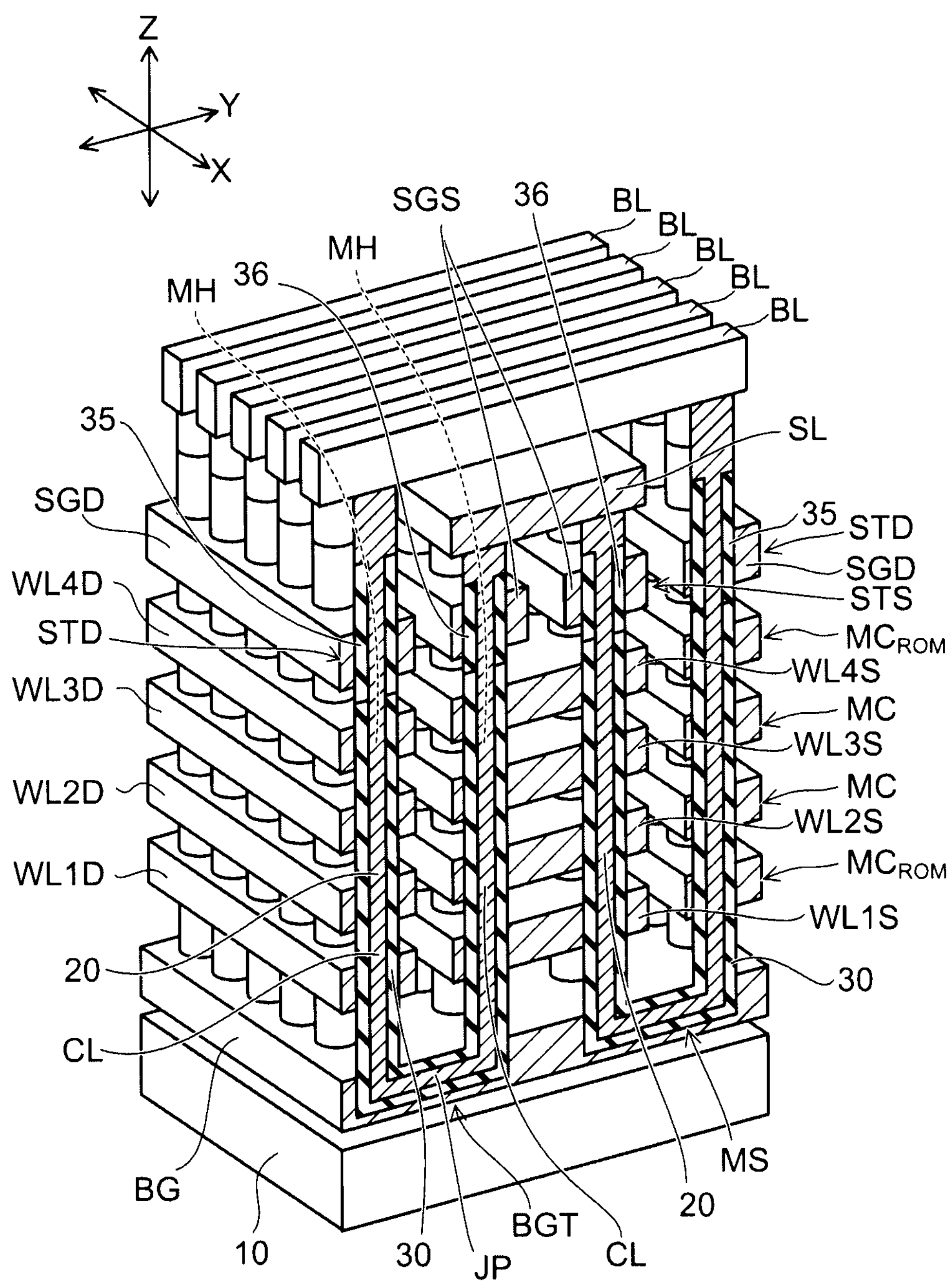
FIG. 1 is a schematic perspective view of a memory cell array of a semiconductor memory device of an embodiment.

FIG. 1 is a schematic perspective view of a memory cell array of a semiconductor memory device of an embodiment. For easier viewing of FIG. 1, the insulating portions other than the insulating film formed on the inner wall of a memory hole MH are not illustrated.

Figure 2:
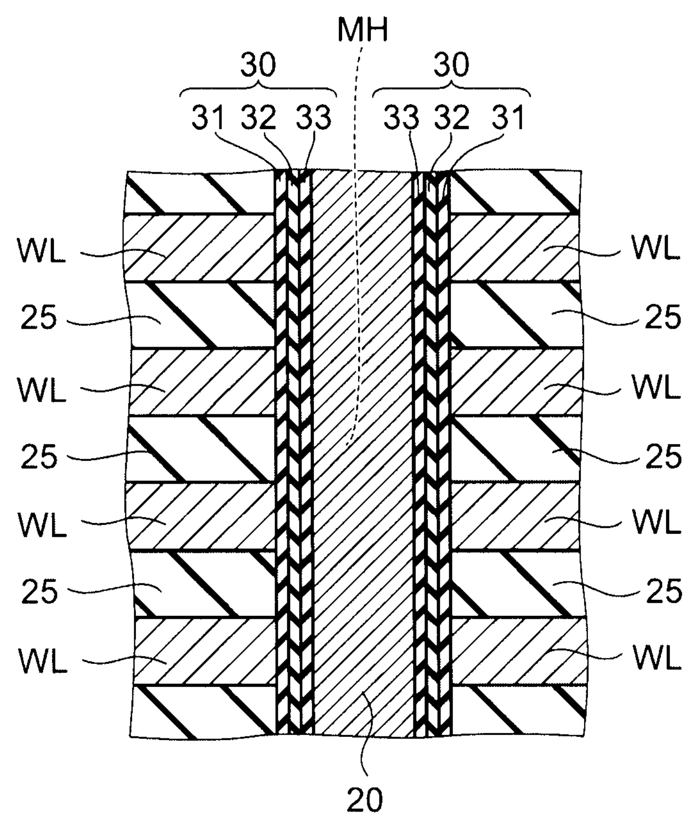
FIG. 2 is an enlarged cross-sectional view of the relevant portion in FIG. 1.

FIG. 2 is an enlarged cross-sectional view of the portion where the memory cell of FIG. 1 is provided.

Figure 3:
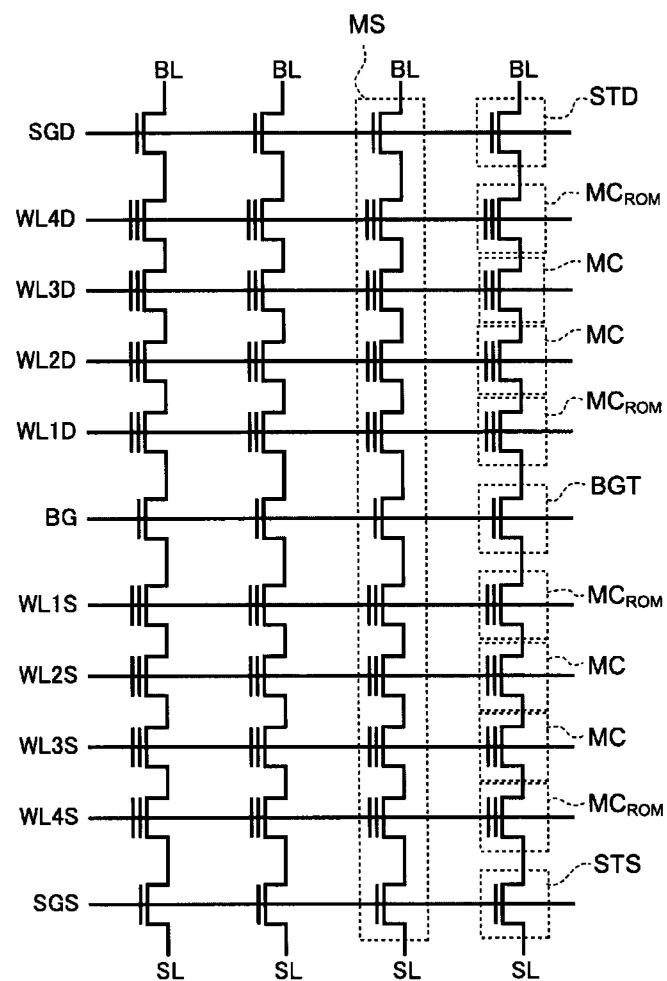
FIG. 3 is a circuit diagram of a memory string of the semiconductor memory device of the embodiment.

FIG. 3 is an equivalent circuit diagram of a memory string MS of FIG. 1. FIG. 3 illustrates, for example, four memory strings MS.

An XYZ orthogonal coordinate system is introduced for convenience of description in FIG. 1. In this coordinate system, two mutually orthogonal directions parallel to the major surface of a substrate 10 are taken as an X direction and a Y direction; and a direction orthogonal to both the X direction and the Y direction is taken as a Z direction.

A back gate BG is provided on the substrate 10 with a not-illustrated interposed insulating layer. The back gate BG is a silicon layer having electrical conductivity by, for example, an impurity being added.

Multiple insulating layers 25 (illustrated in FIG. 2) are stacked alternately with multiple electrode layers WL1D, WL2D, WL3D, WL4D, WL1S, WL2S, WL3S, and WL4S on the back gate BG.

The electrode layer WL1D and the electrode layer WL1S are provided in the same level and are electrode layers of the first layer from the bottom. The electrode layer WL2D and the electrode layer WL2S are provided in the same level and are electrode layers of the second layer from the bottom. The electrode layer WL3D and the electrode layer WL3S are provided in the same level and are electrode layers of the third layer from the bottom. The electrode layer WL4D and the electrode layer WL4S are provided in the same level and are electrode layers of the fourth layer from the bottom.

The electrode layer WL1D and the electrode layer WL1S are divided in the Y direction. The electrode layer WL2D and the electrode layer WL2S are divided in the Y direction. The electrode layer WL3D and the electrode layer WL3S are divided in the Y direction. The electrode layer WL4D and the electrode layer WL4S are divided in the Y direction.

The electrode layers WL1D, WL2D, WL3D, and WL4D are provided between the back gate BG and a drain-side selection gate SGD. The electrode layers WL1S, WL2S, WL3S, and WL4S are provided between the back gate BG and a source-side selection gate SGS.

The number of layers of the electrode layers WL1D, WL2D, WL3D, WL4D, WL1S, WL2S, WL3S, and WL4S is arbitrary and is not limited to the four layers illustrated in FIG. 1. In the description recited below, each of the electrode layers WL1D, WL2D, WL3D, WL4D, WL1S, WL2S, WL3S, and WL4S may be referred to as simply the electrode layer WL.

The electrode layer WL is a silicon layer having electrical conductivity by, for example, an impurity being added. The insulating layer 25 is a tetraethoxysilane (TEOS) layer including, for example, silicon oxide.

The drain-side selection gate SGD is provided on the electrode layer WL4D with a not-illustrated interposed insulating layer. The drain-side selection gate SGD is a silicon layer having electrical conductivity by, for example, an impurity being added.

The source-side selection gate SGS is provided on the electrode layer WL4S with a not-illustrated interposed insulating layer. The source-side selection gate SGS is a silicon layer having electrical conductivity by, for example, an impurity being added.

The drain-side selection gate SGD and the source-side selection gate SGS are divided in the Y direction. In the description recited below, the drain-side selection gate SGD and the source-side selection gate SGS also may be called simply the selection gate SG without discrimination.

A source line SL is provided on the source-side selection gate SGS with insulating layer (not-illustrated). The source line SL is a silicon layer having electrical conductivity by a metal layer or an impurity being added.

Multiple bit lines BL are provided on the drain-side selection gate SGD and the source line SL with insulating layer (not-illustrated). Each of the bit lines BL extends in the Y direction.

A memory hole MH having a U-shaped configuration is multiply made in the back gate BG and the stacked body on the back gate BG. A hole extending in the Z direction is made to pierce the electrode layers WL1D to WL4D and the drain-side selection gate SGD. A hole extending in the Z direction is made to pierce the electrode layers WL1S to WL4S and the source-side selection gate SGS. The pair of holes extending in the Z direction communicates via a recess made inside the back gate BG to obtain the memory hole MH having the U-shaped configuration.

A channel body 20 is provided with a U-shaped configuration in the interior of the memory hole MH. The channel body 20 is, for example, a silicon film. An insulating film 30 is provided between the channel body 20 and the inner wall of the memory hole MH.

A gate insulating film 35 is provided between the channel body 20 and the drain-side selection gate SGD. A gate insulating film 36 is provided between the channel body 20 and the source-side selection gate SGS.

The structure is not limited to the channel body 20 being filled into the entire interior of the memory hole MH. The channel body 20 may be formed such that a cavity remains around the central axis of the memory hole MH; and an insulating substance may be filled into the cavity inside the channel body 20.

The insulating film 30 has an Oxide-Nitride-Oxide (ONO) structure in which, for example, a silicon nitride film is interposed between a pair of silicon oxide films. As illustrated in FIG. 2, a first insulating film 31, a charge storage film 32, and a second insulating film 33 are provided between the channel body 20 and each of the electrode layers WL in order from the electrode layer WL side. The first insulating film 31 contacts the electrode layer WL; the second insulating film 33 contacts the channel body 20; and the charge storage film 32 is provided between the first insulating film 31 and the second insulating film 33.

The channel body 20 functions as the channel of a transistor included in the memory cell; the electrode layer WL functions as the control gate; and the charge storage film 32 functions as a data storage layer configured to store a charge injected from the channel body 20. In other words, a memory cell having a structure in which the control gate is provided around the channel is formed at each of the intersections between the channel body 20 and the electrode layers WL.

The semiconductor memory device of the embodiment can perform the electrical erasing and programming of data and is a nonvolatile semiconductor memory device capable of storing a data even when the power source is OFF.

The memory cell is, for example, a memory cell having a charge trap structure. The charge storage film 32 has many traps to trap charge (electrons) and is, for example, a silicon nitride film. The second insulating film 33 is, for example, a silicon oxide film and forms a potential barrier when the charge is injected from the channel body 20 into the charge storage film 32 or when the charge stored in the charge storage film 32 diffuses into the channel body 20. The first insulating film 31 is, for example, a silicon oxide film that prevents the charge stored in the charge storage film 32 from diffusing into the electrode layer WL.

The drain-side selection gate SGD, the channel body 20, and the gate insulating film 35 between the drain-side selection gate SGD and the channel body 20 are included in a drain-side selection transistor STD as a first selection transistor. The channel body 20 above the drain-side selection transistor STD is connected to the bit line BL.

The source-side selection gate SGS, the channel body 20, and the gate insulating film 36 between the source-side selection gate SGS and the channel body 20 are included in a source-side selection transistor STS as a second selection transistor. The channel body 20 above the source-side selection transistor STS is connected to the source line SL.

The back gate BG, the channel body 20 provided inside the back gate BG, and the insulating film 30 are included in a back gate transistor BGT.

Memory cells having the electrode layers WL4D to WL1D as control gates are multiply provided between the drain-side selection transistor STD and the back gate transistor BGT. Similarly, memory cells having the electrode layers WL1S to WL4S as control gates are multiply provided between the back gate transistor BGT and the source-side selection transistor STS.

The multiple memory cells, the drain-side selection transistor STD, the back gate transistor BGT, and the source-side selection transistor STS are connected in series via the channel body 20 to form one memory string MS having a U-shaped configuration.

One memory string MS includes a pair of columnar portions CL extending in the stacking direction of the stacked body including the multiple electrode layers WL and a linking portion JP buried in the back gate BG to link the pair of columnar portions CL. The multiple memory cells are provided three-dimensionally in the X direction, the Y direction, and the Z direction by the memory string MS being multiply arranged in the X direction and the Y direction.

Figure 4:
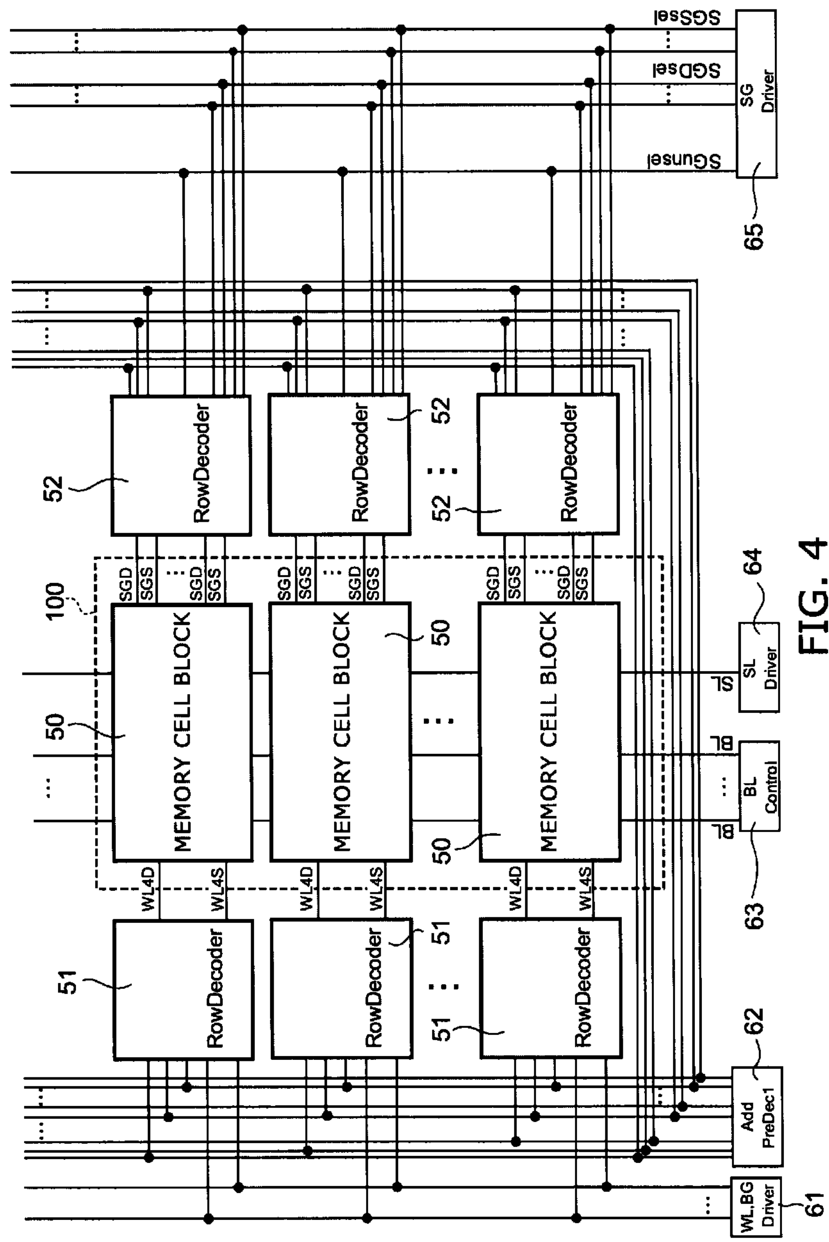
FIG. 4 is a circuit diagram of the semiconductor memory device of the embodiment.

FIG. 4 is a circuit diagram of the semiconductor memory device (one chip) of the embodiment.

Figure 5:
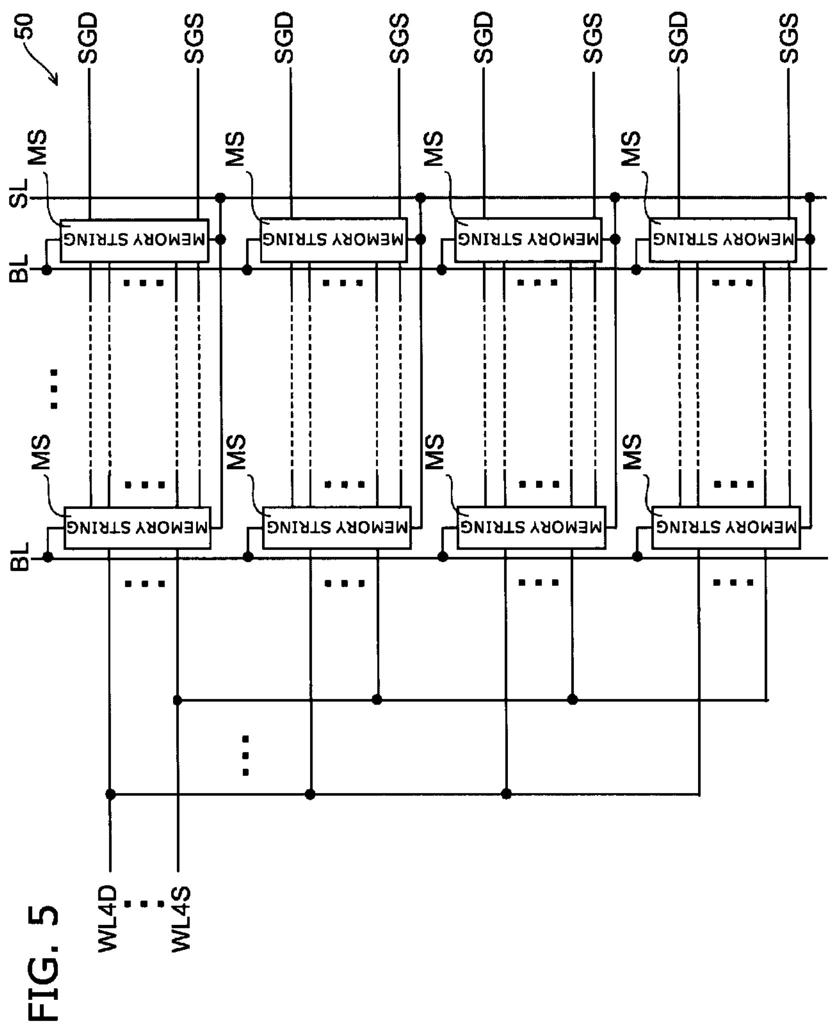
FIG. 5 is a circuit diagram of one block of the memory cell array of the semiconductor memory device of the embodiment.

FIG. 5 is a circuit diagram of one block of a memory cell array 100 of the same semiconductor memory device.

The memory cell array 100, row decoders 51 and 52, a word line driver 61, an address decoder 62, a bit line control circuit 63, a source line driver 64, and a selection gate driver 65 are formed in one chip.

The memory cell array 100 has the structure described above and illustrated in FIG. 1 and is divided into multiple blocks 50. As illustrated in FIG. 5, one of the blocks 50 includes multiple memory strings MS.

Figure 7:
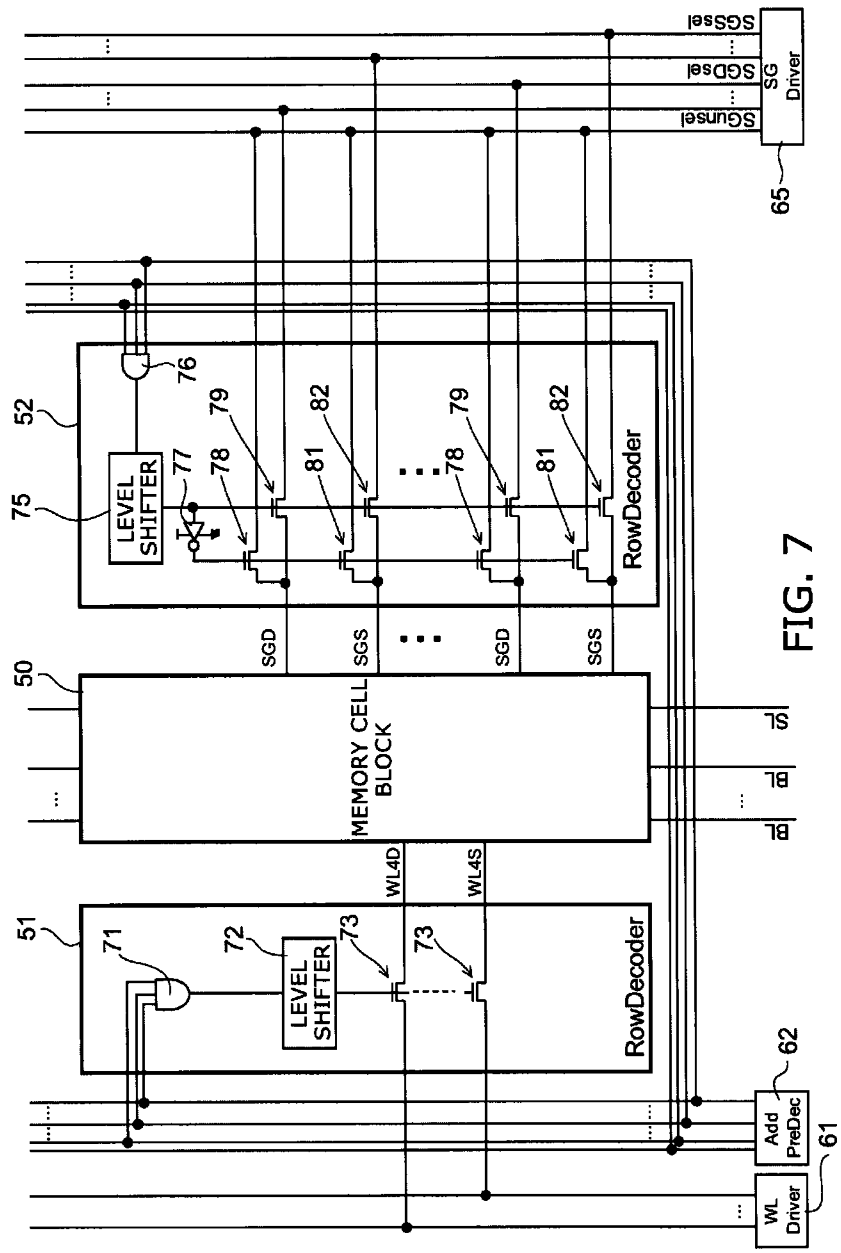
FIG. 7 is a circuit diagram of the row decoders of the semiconductor memory device of the embodiment.

The row decoder 51 and the row decoder 52 are provided corresponding to each of the blocks 50. FIG. 7 is a circuit diagram of the row decoders 51 and 52.

The row decoder 51 includes an AND circuit 71, a level shifter 72, and a switching element 73. The switching element 73 is multiply provided. The switching elements 73 are connected from the word line driver 61 to the corresponding electrode layers WL1D, WL2D, WL3D, WL4D, WL1S, WL2S, WL3S, and WL4S.

The switching element 73 and the switching elements described below are, for example, field effect transistors.

The gate of the switching element 73 is connected to the AND circuit 71 via the level shifter 72. The switching element 73 is switched ON and OFF according to the high level or low level output signal of the AND circuit 71.

A signal of the address decoder 62 is input to the AND circuit 71. The address decoder 62 is configured to select the electrode layers WL1D, WL2D, WL3D, WL4D, WL1S, WL2S, WL3S, and WL4S. In other words, the certain potential is applied from the word line driver 61 to the electrode layers WL1D, WL2D, WL3D, WL4D, WL1S, WL2S, WL3S, and WL4S connected to the switching elements 73 switched ON by the signal of the address decoder 62.

The row decoder 52 includes an AND circuit 76, a level shifter 75, a NOT circuit 77, and switching elements 78, 79, 81, and 82.

The switching element 78 is multiply provided. Each of the switching elements 78 is connected from an unselect signal output line SGunsel of the selection gate driver 65 to the corresponding drain-side selection gate SGD.

The switching element 79 is multiply provided. Each of the switching elements 79 is connected from a drain-side select signal output line SGDsel of the selection gate driver 65 to the corresponding drain-side selection gate SGD.

The switching element 81 is multiply provided. Each of the switching elements 81 is connected from the unselect signal output line SGunsel of the selection gate driver 65 to the corresponding source-side selection gate SGS.

The switching element 82 is multiply provided. Each of the switching elements 82 is connected from the source-side select signal output line SGSsel of the selection gate driver 65 to the corresponding source-side selection gate SGS.

The gate of each of the switching elements 78, 79, 81, and 82 is connected to the AND circuit 76 via the level shifter 75. Each of the switching elements 78, 79, 81, and 82 is switched ON and OFF according to the high level or low level output signal of the AND circuit 76.

The NOT circuit 77 is connected between the level shifter 75 and the switching elements 78. Accordingly, mutually inverted gate signals are applied to the gate of the switching element 78 and the gate of the switching element 79; and one selected from the switching element 78 and the switching element 79 is selectively switched ON.

The NOT circuit 77 is connected also between the level shifter 75 and the switching elements 81. Accordingly, mutually inverted gate signals are applied to the gate of the switching element 81 and the gate of the switching element 82; and one selected from the switching element 81 and the switching element 82 is selectively switched ON.

A signal of the address decoder 62 is input to the AND circuit 76. The address decoder 62 is configured to select the selection gate SG (the drain-side selection gate SGD and the source-side selection gate SGS).

The certain potential is applied via the drain-side select signal output line SGDsel of the selection gate driver 65 to the drain-side selection gate SGD connected to the switching element 79 switched ON by the signal of the address decoder 62.

The certain potential is applied via the unselect signal output line SGunsel of the selection gate driver 65 to the drain-side selection gate SGD connected to the switching element 78 switched ON by the signal of the address decoder 62.

The certain potential is applied via the source-side select signal output line SGSsel of the selection gate driver 65 to the source-side selection gate SGS connected to the switching element 82 switched ON by the signal of the address decoder 62.

The certain potential is applied via the unselect signal output line SGunsel of the selection gate driver 65 to the source-side selection gate SGS connected to the switching element 81 switched ON by the signal of the address decoder 62.

Figure 8:
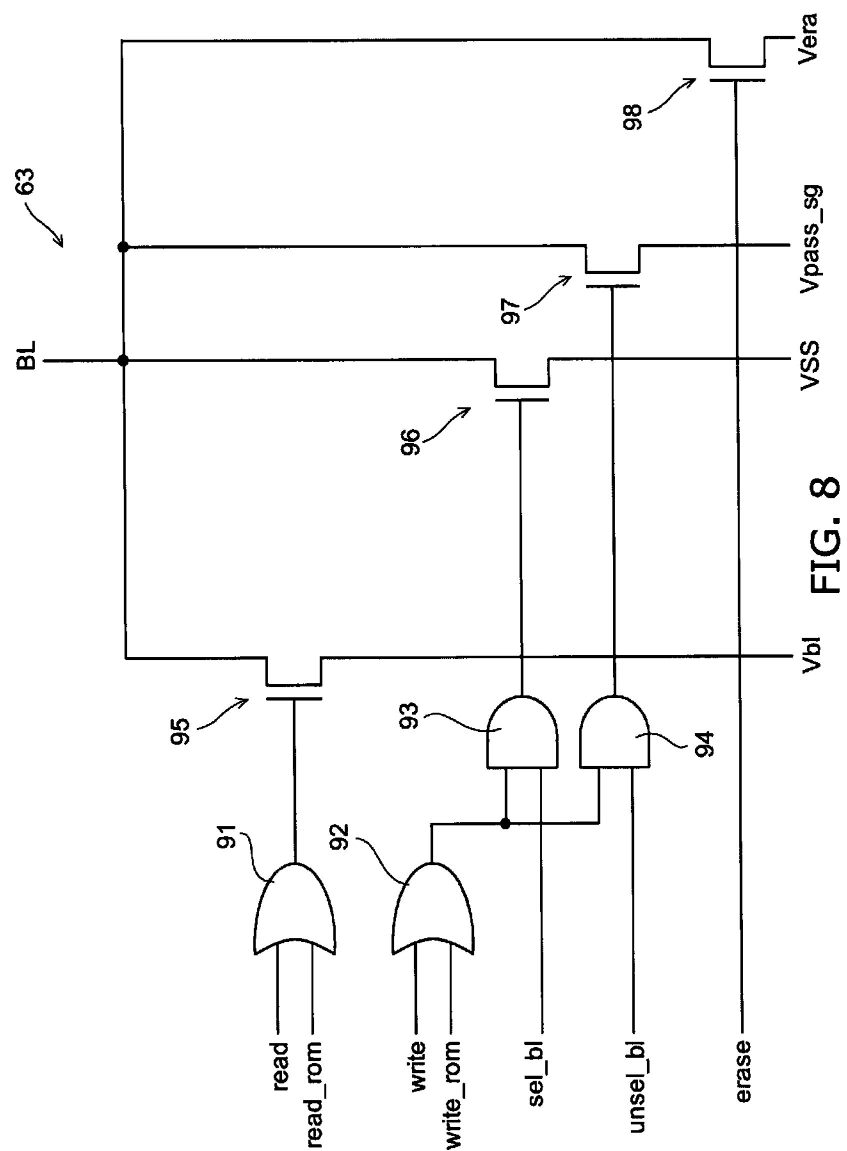
FIG. 8 is a circuit diagram of the bit line control circuit of the semiconductor memory device of the embodiment.

FIG. 8 is a circuit diagram of the bit line control circuit 63.

The bit line control circuit 63 includes OR circuits 91 and 92, AND circuits 93 and 94, and switching elements 95 to 98.

An output signal of the OR circuit 91 is input to the gate of the switching element 95. A signal read and a signal read_rom are input to the OR circuit 91. The signal read_rom corresponds to a data read command of a read-only memory cell $MC_{ROM}$ described below. The signal read corresponds to a data read command of a normal memory cell MC other than the read-only memory cell $MC_{ROM}$.

When at least one selected from the signal read and the signal read_rom is input as the high-level signal to the OR circuit 91, the OR circuit 91 outputs the high-level signal to the gate of the switching element 95. Thereby, the switching element 95 is switched ON; and a BL pre-charge potential Vbl is applied to the bit line BL. The BL pre-charge potential Vbl is, for example, several volts.

A signal write and a signal write_rom are input to the OR circuit 92. The signal write_rom corresponds to a data program command of the read-only memory cell $MC_{ROM}$. The signal write corresponds to a data program command of the normal memory cell MC other than the read-only memory cell $MC_{ROM}$.

When at least one selected from the signal write and the signal write_rom is input as a high-level signal to the OR circuit 92, the OR circuit 92 outputs the high-level signal to the AND circuit 93 and the AND circuit 94.

The signal sel_bl is input to the AND circuit 93. The signal sel_bl corresponds to a select command of the bit line BL. The signal unsel_bl is input to the AND circuit 94. The signal unsel_bl corresponds to an unselect command of the bit line BL.

When both of the two inputs of the AND circuit 93 are switched to the high level, the AND circuit 93 outputs the high-level signal to the gate of a switching element 96. Thereby, the switching element 96 is switched ON; and a potential VSS is applied to the bit line BL. The potential VSS is, for example, 0 V.

When both of the two inputs of the AND circuit 94 are switched to the high level, the AND circuit 94 outputs the high-level signal to the gate of a switching element 97. Thereby, the switching element 97 is switched ON; and an intermediate potential Vpass_sg is applied to the bit line BL. The intermediate potential Vpass_sg is about, for example, 10 V.

A signal erase is input to the gate of the switching element 98. The signal erase corresponds to a data erase operation command. When the signal erase is input as the high-level signal to the gate of the switching element 98, the switching element 98 is switched ON. Thereby, an erasing potential Vera is applied to the bit line BL. The erasing potential Vera is about, for example, 20 V.

Figure 9:
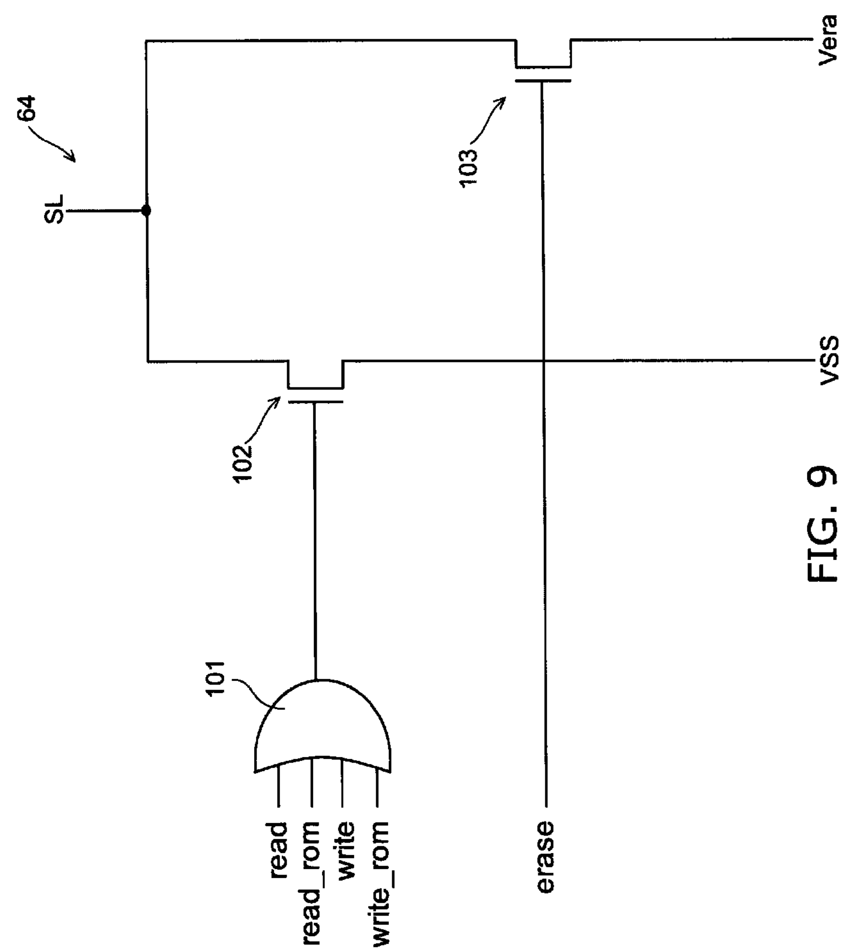
FIG. 9 is a circuit diagram of the source line driver of the semiconductor memory device of the embodiment.

FIG. 9 is a circuit diagram of the source line driver 64.

The source line driver 64 includes an OR circuit 101 and switching elements 102 and 103.

The signal read, the signal read_rom, the signal write, and the signal write_rom are input to the OR circuit 101. When at least one selected from these signals is input as the high-level signal to the OR circuit 101, the OR circuit 101 outputs the high-level signal to the gate of the switching element 102. Thereby, the switching element 102 is switched ON; and the potential VSS is applied to the source line SL.

When the signal erase is input as the high-level signal to the gate of the switching element 103, the switching element 103 is switched ON. Thereby, the erasing potential Vera is applied to the source line SL.

Figure 10:
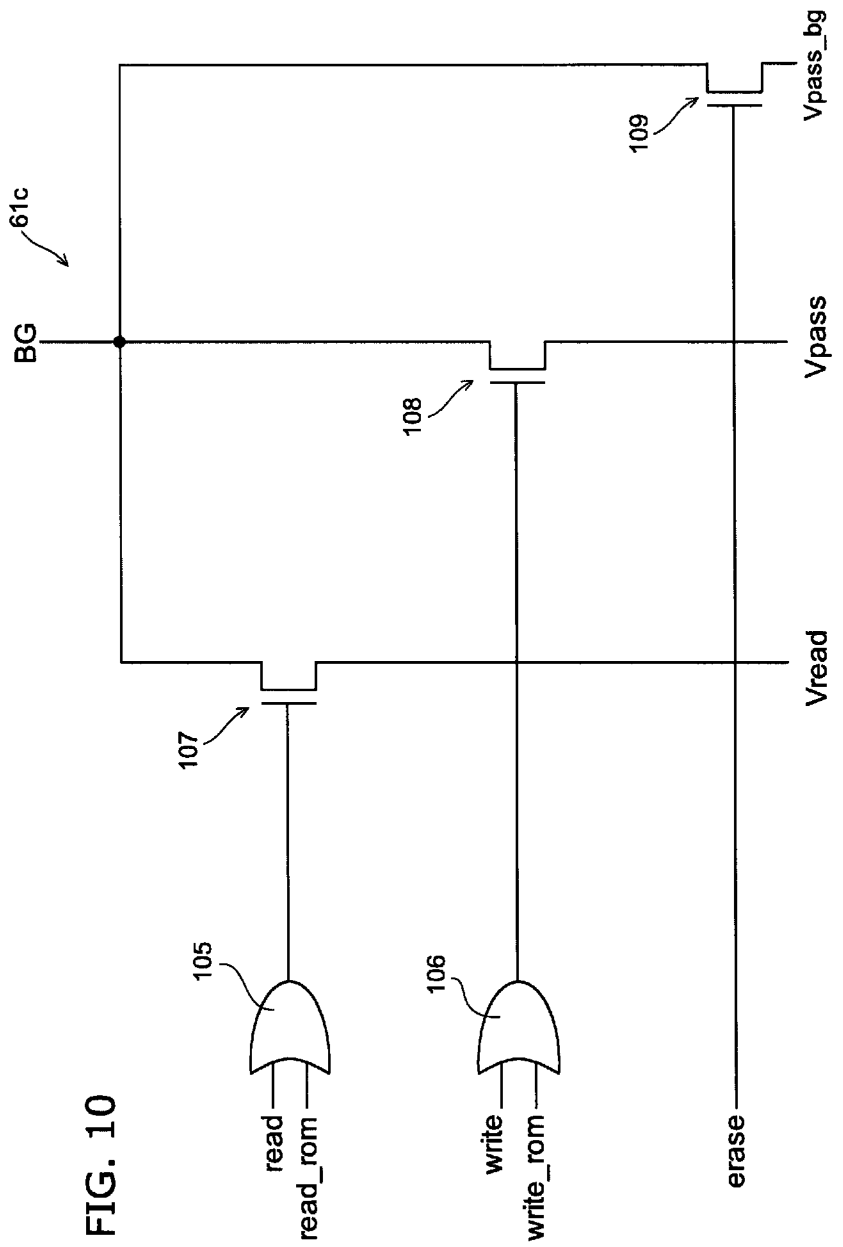
FIG. 10 is a circuit diagram of a back gate driver of the semiconductor memory device of the embodiment.

FIG. 10 is a circuit diagram of a back gate driver 61*c*.

The back gate driver 61*c* includes OR circuits 105 and 106 and switching elements 107 to 109.

The signal read and the signal read_rom are input to the OR circuit 105. When at least one selected from these signals is input as the high-level signal to the OR circuit 105, the OR circuit 105 outputs the high-level signal to the gate of the switching element 107. Thereby, the switching element 107 is switched ON; and a reading potential Vread is applied to the back gate BG.

The signal write and the signal write_rom are input to the OR circuit 106. When at least one selected from these signals is input as the high-level signal to the OR circuit 106, the OR circuit 106 outputs the high-level signal to the gate of a switching element 108. Thereby, the switching element 108 is switched ON; and an intermediate potential Vpass is applied to the back gate BG. The intermediate potential Vpass is about, for example, 10 V.

When the signal erase is input as the high-level signal to the gate of the switching element 109, the switching element 109 is switched ON. Thereby, an intermediate potential Vpass_bg is applied to the back gate BG. The intermediate potential Vpass_bg is about, for example, 10 V.

Figure 11:
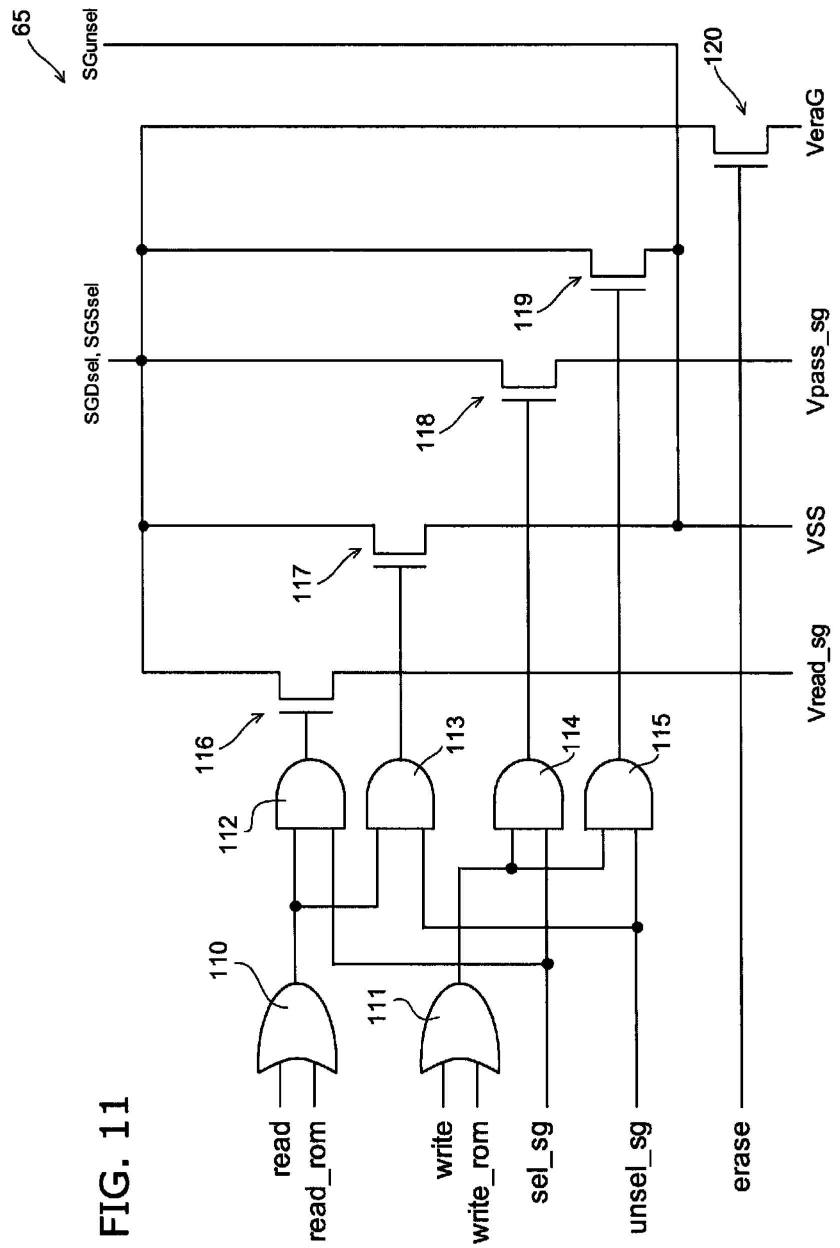
FIG. 11 is a circuit diagram of the selection gate driver of the semiconductor memory device of the embodiment.

FIG. 11 is a circuit diagram of the selection gate driver 65.

The selection gate driver 65 includes OR circuits 110 and 111, AND circuits 112 to 115, and switching elements 116 to 120.

The signal read and the signal read_rom are input to the OR circuit 110. When at least one selected from these signals is input as the high-level signal to the OR circuit 110, the OR circuit 110 outputs the high-level signal to the AND circuits 112 and 113.

The signal write and the signal write_rom are input to the OR circuit 111. When at least one selected from these signals is input as the high-level signal to the OR circuit 111, the OR circuit 111 outputs the high-level signal to the AND circuits 114 and 115.

The signal sel_sg is input to the AND circuit 112. The signal sel_sg corresponds to a select command of the selection gate SG. When both of the two inputs of the AND circuit 112 are switched to the high level, the AND circuit 112 outputs the high-level signal to the gate of the switching element 116. Thereby, the switching element 116 is switched ON; and a reading potential Vread_sg is applied to the select signal output lines SGDsel and SGSsel illustrated in FIG. 4.

The signal unsel_sg is input to the AND circuit 113. The signal unsel_sg corresponds to an unselect command of the selection gate SG. When both of the two inputs of the AND circuit 113 are switched to the high level, the AND circuit 113 outputs the high-level signal to the gate of the switching element 117. Thereby, the switching element 117 is switched ON; and the potential VSS is applied to the select signal output lines SGDsel and SGSsel.

The signal sel_sg is input also to the AND circuit 114. When both of the two inputs of the AND circuit 114 are switched to the high level, the AND circuit 114 outputs the high-level signal to the gate of the switching element 118. Thereby, the switching element 118 is switched ON; and the intermediate potential Vpass_sg is applied to the select signal output lines SGDsel and SGSsel. The intermediate potential Vpass_sg is about, for example, 10 V.

The signal unsel_sg is input also to the AND circuit 115. When both of the two inputs of the AND circuit 115 are switched to the high level, the AND circuit 115 outputs the high-level signal to the gate of the switching element 119. Thereby, the switching element 119 is switched ON; and the potential VSS is applied to the select signal output lines SGDsel and SGSsel.

When the signal erase is input as the high-level signal to the gate of the switching element 120, the switching element 120 is switched ON. Thereby, an erasing potential VeraG is applied to the select signal output lines SGDsel and SGSsel. The erasing potential VeraG is lower than the erasing potential Vera applied to the bit line BL and the source line SL in the erasing operation by about 10 V.

The potential VSS is applied to the unselect signal output line SGunsel.

Figure 12:
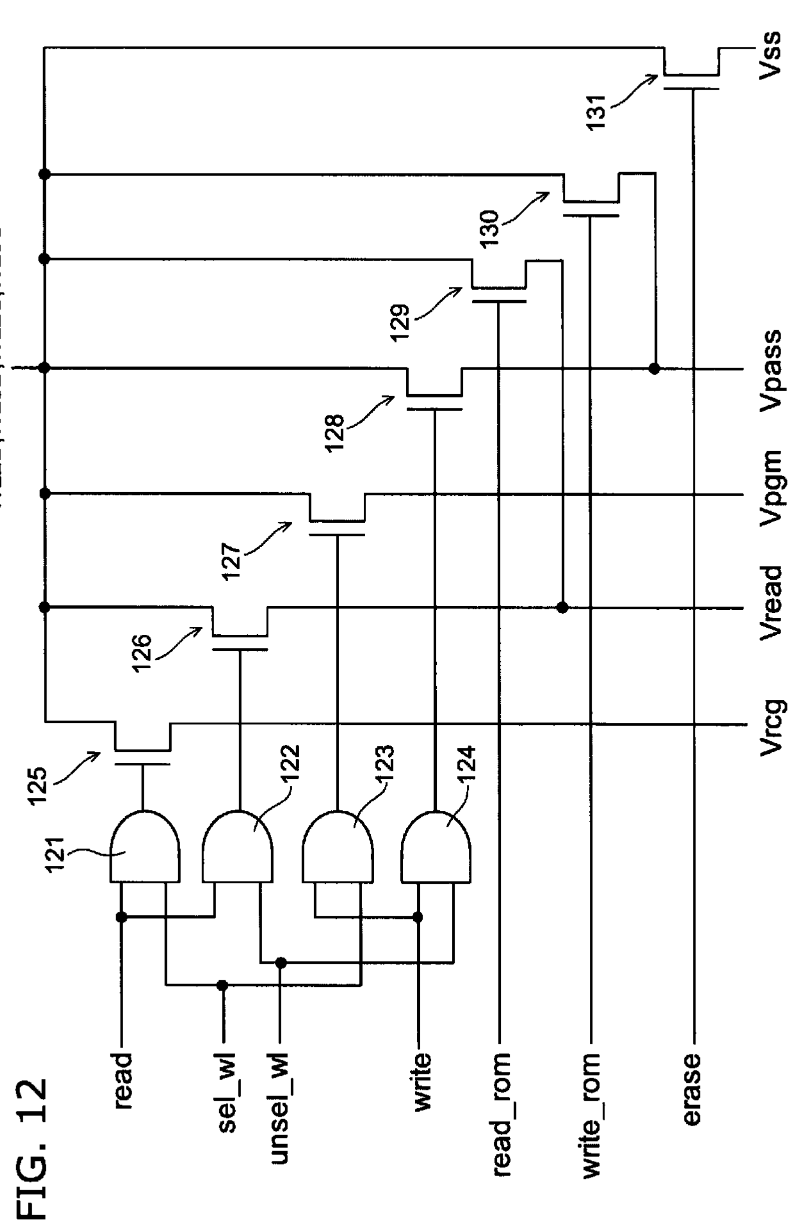
FIG. 12 is a circuit diagram of a word line driver of the normal memory cells of the semiconductor memory device of the embodiment.

FIG. 12 is a circuit diagram of a word line driver 61*a* connected to the electrode layers WL2D, WL3D, WL2S, and WL3S of the normal memory cells MC other than the read-only memory cells $MC_{ROM}$.

The word line driver 61*a* includes AND circuits 121 to 124 and switching elements 125 to 131.

The signal read and the signal sel_wl are input to the AND circuit 121. The signal sel_wl corresponds to a select command of the electrode layers WL2D, WL3D, WL2S, and WL3S. When both of the two inputs of the AND circuit 121 are switched to the high level, the AND circuit 121 outputs the high-level signal to the gate of the switching element 125. Thereby, the switching element 125 is switched ON; and a read determination potential Vrcg is applied to the electrode layers WL2D, WL3D, WL2S, and WL3S.

The signal read and the signal unsel_wl are input to the AND circuit 122. The signal unsel_wl corresponds to an unselect command of the electrode layers WL2D, WL3D, WL2S, and WL3S. When both of the two inputs of the AND circuit 122 are switched to the high level, the AND circuit 122 outputs the high-level signal to the gate of the switching element 126. Thereby, the switching element 126 is switched ON; and the reading potential Vread is applied to the electrode layers WL2D, WL3D, WL2S, and WL3S.

The signal write and the signal sel_wl are input to the AND circuit 123. When both of the two inputs of the AND circuit 123 are switched to the high level, the AND circuit 123 outputs the high-level signal to the gate of the switching element 127. Thereby, the switching element 127 is switched ON; and a programming potential Vpgm is applied to the electrode layers WL2D, WL3D, WL2S, and WL3S. The programming potential Vpgm is about, for example, 20 V.

The signal write and the signal unsel_wl are input to the AND circuit 124. When both of the two inputs of the AND circuit 124 are switched to the high level, the AND circuit 124 outputs the high-level signal to the gate of the switching element 128. Thereby, the switching element 128 is switched ON; and the intermediate potential Vpass is applied to the electrode layers WL2D, WL3D, WL2S, and WL3S.

When the signal read_rom is input as the high-level signal to the gate of the switching element 129, the switching element 129 is switched ON. Thereby, the reading potential Vread is applied to the electrode layers WL2D, WL3D, WL2S, and WL3S.

When the signal write_rom is input as the high-level signal to the gate of the switching element 130, the switching element 130 is switched ON. Thereby, the intermediate potential Vpass is applied to the electrode layers WL2D, WL3D, WL2S, and WL3S.

When the signal erase is input as the high-level signal to the gate of the switching element 131, the switching element 131 is switched ON. Thereby, the potential VSS is applied to the electrode layers WL2D, WL3D, WL2S, and WL3S.

Figure 13:
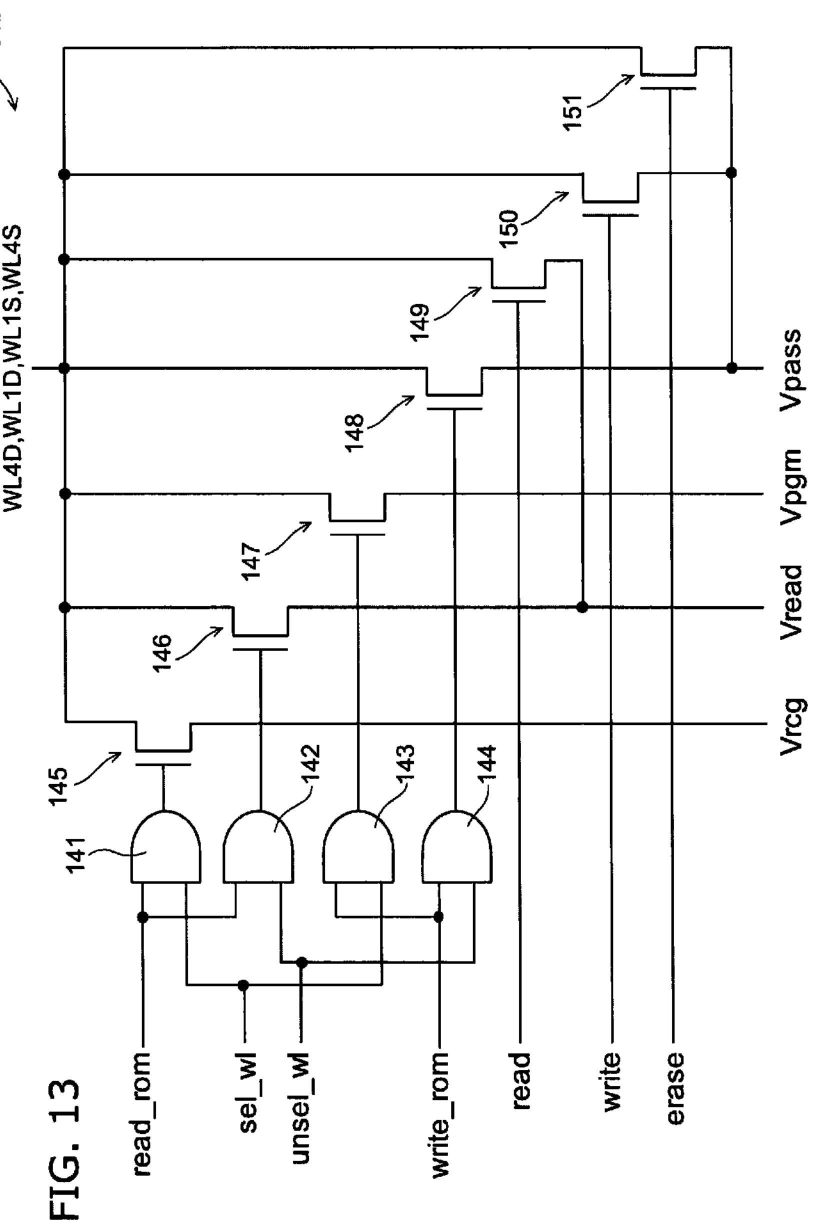
FIG. 13 is a circuit diagram of a word line driver of the read-only memory cell of the semiconductor memory device of the embodiment.

FIG. 13 is a circuit diagram of a word line driver 61*b* connected to the electrode layers WL4D, WL1D, WL1S, and WL4S of the read-only memory cell $MC_{ROM}$.

The word line driver 61*b* includes AND circuits 141 to 144 and switching elements 145 to 151.

The signal read_rom and the signal sel_wl are input to the AND circuit 141. Here, the signal sel_wl corresponds to a select command of the electrode layers WL4D, WL1D, WL1S, and WL4S. When both of the two inputs of the AND circuit 141 are switched to the high level, the AND circuit 141 outputs the high-level signal to the gate of the switching element 145. Thereby, the switching element 145 is switched ON; and the read determination potential Vrcg is applied to the electrode layers WL4D, WL1D, WL1S, and WL4S.

The signal read_rom and the signal unsel_wl are input to the AND circuit 142. Here, the signal unsel_wl corresponds to an unselect command of the electrode layers WL4D, WL1D, WL1S, and WL4S. When both of the two inputs of the AND circuit 142 are switched to the high level, the AND circuit 142 outputs the high-level signal to the gate of the switching element 146. Thereby, the switching element 146 is switched ON; and the reading potential Vread is applied to the electrode layers WL4D, WL1D, WL1S, and WL4S.

The signal write_rom and the signal sel_wl are input to the AND circuit 143. When both of the two inputs of the AND circuit 143 are switched to the high level, the AND circuit 143 outputs the high-level signal to the gate of the switching element 147. Thereby, the switching element 147 is switched ON; and the programming potential Vpgm is applied to the electrode layers WL4D, WL1D, WL1S, and WL4S.

The signal write_rom and the signal unsel_wl are input to the AND circuit 144. When both of the two inputs of the AND circuit 144 are switched to the high level, the AND circuit 144 outputs the high-level signal to the gate of the switching element 148. Thereby, the switching element 148 is switched ON; and the intermediate potential Vpass is applied to the electrode layers WL4D, WL1D, WL1S, and WL4S.

When the signal read is input as the high-level signal to the gate of the switching element 149, the switching element 149 is switched ON. Thereby, the reading potential Vread is applied to the electrode layers WL4D, WL1D, WL1S, and WL4S.

When the signal write is input as the high-level signal to the gate of the switching element 150, the switching element 150 is switched ON. Thereby, the intermediate potential Vpass is applied to the electrode layers WL4D, WL1D, WL1S, and WL4S.

When the signal erase is input as the high-level signal to the gate of the switching element 151, the switching element 151 is switched ON. Thereby, the intermediate potential Vpass is applied to the electrode layers WL4D, WL1D, WL1S, and WL4S.

A method of operating the semiconductor memory device of the embodiment will now be described.

FIG. 6 illustrates an example of the potentials applied to the bit line BL, the drain-side selection gate SGD, the electrode layers WL1D to WL4D and WL1S to WL4S, the back gate BG, the source-side selection gate SGS, and the source line SL when programming, reading, and erasing data.

In the embodiment, at least one selected from the memory cell of the uppermost layer and the memory cell of the lowermost layer is used as the read-only memory cell $MC_{ROM}$. In other words, in the example illustrated in FIG. 1 and FIG. 3, memory cells having the electrode layers WL4D and WL4S of the uppermost layer as control gates and memory cells having the electrode layers WL1D and WL1S of the lowermost layer as control gates are used as the read-only memory cells $MC_{ROM}$.

Read-only data, which is unerasable once programmed, is programmed to the read-only memory cells $MC_{ROM}$. In other words, the erasing operation of the data stored in the read-only memory cells $MC_{ROM}$ is prohibited.

The memory cells other than the read-only memory cells $MC_{ROM}$ are used as the normal memory cells MC for which data is erasable, that is, for which data is reprogrammable. In the example illustrated in FIG. 1 and FIG. 3, the memory cells having the electrode layers WL2D and WL2S of the second layer as the control gates and the memory cells having the electrode layers WL3D and WL3S of the third layer as the control gates are used as the normal reprogrammable memory cells MC.

All of the memory cells of the uppermost layer may be used as the read-only memory cells $MC_{ROM}$; or only a portion of the memory cells of the uppermost layer may be used as the read-only memory cells $MC_{ROM}$. All of the memory cells of the lowermost layer also may be used as the read-only memory cells $MC_{ROM}$; or only a portion of the memory cells of the lowermost layer may be used as the read-only memory cells $MC_{ROM}$. Only the memory cells of the uppermost layer may be used as the read-only memory cells $MC_{ROM}$; and only the memory cells of the lowermost layer may be used as the read-only memory cells $MC_{ROM}$. Memory cells of the uppermost layer or the lowermost layer to which the read-only data is not programmed are dummy cells in which the data is not stored.

In other words, the memory cells of the uppermost layer and the memory cells of the lowermost layer are not used as the normal memory cells, are used as the read-only memory cells $MC_{ROM}$, or are dummy cells.

First, the programming of the data to the normal memory cells MC will be described.

As illustrated in FIG. 6, 0 V is applied to the bit line BL, the source-side selection gate SGS, and the source line SL. The intermediate potential Vpass_sg is applied to the drain-side selection gate SGD. The intermediate potential Vpass_sg is a potential that switches the drain-side selection transistor STD ON and is about, for example, 10 V. The intermediate potential Vpass is applied to the back gate BG. The intermediate potential Vpass is a potential that switches the back gate transistor BGT ON and is about, for example, 10 V.

The programming potential Vpgm is applied to the electrode layers WL3D, WL2D, WL2S, and WL3S of the selected memory cells MC to be programmed. The intermediate potential Vpass is applied to the electrode layers WL3D, WL2D, WL2S, and WL3S of the unselected memory cells MC not to be programmed. The intermediate potential Vpass is applied to the electrode layers WL4D, WL1D, WL1S, and WL4S of the read-only memory cells $MC_{ROM}$.

The programming potential Vpgm is higher than the intermediate potential Vpass and is about, for example, 20 V. Thereby, the strength of the electric field applied to the charge storage film 32 increases only for the selected memory cells MC to be programmed. Accordingly, electrons are injected into the charge storage film 32 of the selected memory cells MC to be programmed due to the potential difference between the channel body 20, to which 0 V is applied via the bit line BL, and the electrode layers WL3D, WL2D, WL2S, and WL3S, to which the programming potential Vpgm is applied; and the threshold voltages of the selected memory cells MC are shifted in the positive direction. For the read-only memory cells $MC_{ROM}$ and the unselected memory cells MC for which the intermediate potential Vpass is applied to the electrode layers, electrons are not injected into the charge storage film 32 and data is not programmed.

The programming of the data to the read-only memory cells $MC_{ROM}$ will now be described.

Similarly to the programming of the data to the normal memory cells MC, 0 V is applied to the bit line BL, the source-side selection gate SGS, and the source line SL. The intermediate potential Vpass_sg is applied to the drain-side selection gate SGD. The intermediate potential Vpass is applied to the back gate BG.

For example, in the case where the read-only data is programmed to the read-only memory cell $MC_{ROM}$ having the electrode layer WL4D as the control gate, the programming potential Vpgm is applied to the electrode layer WL4D.

The intermediate potential Vpass is applied to the electrode layers WL1D, WL1S, and WL4S of the other read-only memory cells $MC_{ROM}$ and the electrode layers WL3D, WL2D, WL2S, and WL3S of the normal memory cells MC.

Accordingly, the strength of the electric field applied to the charge storage film 32 increases only for the read-only memory cell $MC_{ROM}$ having the electrode layer WL4D as the control gate; electrons are injected into the charge storage film 32 of the read-only memory cell $MC_{ROM}$; and the threshold voltage of the read-only memory cell $MC_{ROM}$ is shifted in the positive direction. For the other read-only memory cells $MC_{ROM}$ and the normal memory cells MC for which the intermediate potential Vpass is applied to the electrode layers, electrons are not injected into the charge storage film 32; and data is not programmed.

In the case where data is programmed to the other read-only memory cells $MC_{ROM}$, the programming potential Vpgm is applied to the electrode layers of the other read-only memory cells $MC_{ROM}$.

The read-only data stored in the read-only memory cells $MC_{ROM}$ is, for example, setting information used to operate the memory cells (the normal memory cells MC and the read-only memory cells $MC_{ROM}$) with the certain performance.

In tests prior to shipping, the settings of each of the potentials illustrated in FIG. 6, the currents, the application times, etc., are programmed and stored in the read-only memory cells $MC_{ROM}$ allotted to the memory cells of the uppermost layer or the memory cells of the lowermost layer.

For example, the optimal value of the reading potential Vread may be selected for each chip from sixteen values when shipping. As illustrated in Table 1, Vread may be selected from, for example, sixteen levels in a range of 3.00 to 6.75 (V).

TABLE 1

| $MC_{ROM}1$ | $MC_{ROM}2$ | $MC_{ROM}3$ | $MC_{ROM}4$ | Vread Setting |
|---|---|---|---|---|
| 0 | 0 | 0 | 0 | 3.00 V |
| 0 | 0 | 0 | 1 | 3.25 V |
| 0 | 0 | 1 | 0 | 3.50 V |
| 0 | 0 | 1 | 1 | 3.75 V |
| 0 | 1 | 0 | 0 | 4.00 V |
| 0 | 1 | 0 | 1 | 4.25 V |
| 0 | 1 | 1 | 0 | 4.50 V |
| 0 | 1 | 1 | 1 | 4.75 V |
| 1 | 0 | 0 | 0 | 5.00 V |
| 1 | 0 | 0 | 1 | 5.25 V |
| 1 | 0 | 1 | 0 | 5.50 V |
| 1 | 0 | 1 | 1 | 5.75 V |
| 1 | 1 | 0 | 0 | 6.00 V |
| 1 | 1 | 0 | 1 | 6.25 V |
| 1 | 1 | 1 | 0 | 6.50 V |
| 1 | 1 | 1 | 1 | 6.75 V |

For example, for a binary memory cell capable of storing a datum "0" and a datum "1," four read-only memory cells $MC_{ROM}$1 to $MC_{ROM}$4 are allotted for storing the Vread settings because $16=2^4$. Each of the settings of Vread may be set by combining the datum "0" and the datum "1" of the four read-only memory cells $MC_{ROM}$1 to $MC_{ROM}$4.

In the semiconductor memory device according to the embodiment, the erasing operation is performed for the block unit. A block including an operationally defective memory cell which is incapable of normal operation due to some cause is treated as a bad block.

It is not always possible to ship in a state in which all of the blocks are normal; and shipping is permissible if the number of normal blocks meeting or exceeding some specification can be secured. When shipping, an operation test is performed on all of the blocks; and the blocks that are incapable of normal operation are bad blocks. Then, to prohibit access to the bad blocks during use, the address information of the bad blocks is stored in the read-only memory cells $MC_{ROM}$. Thereby, the user can be prevented from erroneously using the bad blocks.

In other words, in the embodiment, at least one selected from the memory cell of the uppermost layer and the memory cell of the lowermost layer is used as the read-only memory cell $MC_{ROM}$; and the operation settings of the memory cells, the address information of the bad blocks, etc., described above are stored as the unerasable read-only data in the read-only memory cells $MC_{ROM}$.

The memory cell of the uppermost layer is adjacent to the selection gate SG (the drain-side selection gate SGD and the source-side selection gate SGS) in the stacking direction. The memory cell of the lowermost layer is adjacent to the back gate BG in the stacking direction. Therefore, the patterned configurations and the device characteristics of the memory cells of the uppermost layer and the lowermost layer easily differ from those of the other memory cells.

From the aspect of increasing process efficiency and reducing costs, the memory holes MH are made by stacking the multiple electrode layers WL and the multiple insulating layers 25 and then collectively etching the stacked body thereof using, for example, Reactive Ion Etching (RIE). In the case where the number of stacks of the electrode layer WL and the insulating layer 25 is increased to increase the storage capacity, the aspect ratio (the ratio of the depth to the hole diameter) of the memory hole MH increases; and it becomes easy for the hole diameter of the memory hole MH at the upper portion to increase and the hole diameter at the lower portion to decrease. This may cause the characteristics of the memory cells of the uppermost layer and the memory cells of the lowermost layer to fluctuate from the characteristics of the other memory cells.

The thickness of the insulating layer 25 between the electrode layers WL is substantially the same; and the spacing between the electrode layers WL is substantially the same. Conversely, there are cases where the spacing between the electrode layer WL of the uppermost layer and the selection gate SG (the drain-side selection gate SGD and the source-side selection gate SGS) and the spacing between the back gate BG and the electrode layer WL of the lowermost layer are different from the spacing between the electrode layers WL. This also may cause the characteristics of the memory cells of the uppermost layer and the memory cells of the lowermost layer to fluctuate from the characteristics of the other memory cells.

In the embodiment, the memory cells of the uppermost layer and the lowermost layer, of which the characteristics fluctuate more easily than those of the other memory cells, function as the read-only memory cells $MC_{ROM}$ which are not used by the user in normal use. The memory cells other than the memory cells of the uppermost layer and the memory cells of the lowermost layer are used during normal use in which the user programs, erases, and reprograms character data, image data, video image data, etc. The characteristics among the memory cells other than the memory cells of the uppermost layer and the memory cells of the lowermost layer are substantially the same. Accordingly, effects of characteristic fluctuation between the memory cells do not occur during normal use; and the desired performance and high reliability are obtained.

In the structure described above, it may be envisaged to use the memory cells of the uppermost layer and the lowermost layer as dummy cells without storing data because the characteristics of the memory cells of the uppermost layer and the lowermost layer fluctuate easily. However, in the embodiment, the memory cells can be effectively used without going to waste by using the memory cells of the uppermost layer and the lowermost layer as the read-only memory cells $MC_{ROM}$.

Although the characteristics of the memory cells of the uppermost layer and the lowermost layer fluctuate easily from those of the other memory cells, the memory cells of the uppermost layer and the lowermost layer are not problematic as memory cells and are usable. The memory cells of the uppermost layer and the lowermost layer are difficult to use as the memory cells during normal use because the characteristic fluctuation occurs easily; and by discriminating the memory cells of the uppermost layer and the lowermost layer from the memory cells during normal use and by using the memory cells of the uppermost layer and the lowermost layer for other applications, the characteristic fluctuation between the memory cells does not affect the use by the user. Moreover, by storing the read-only data such as the operation settings of the memory cells and the bad block address information, it is unnecessary to secure a separate dedicated region or block; and the memory cells can be effectively used.

There are cases where it is preferable for the read-only memory cells $MC_{ROM}$ used for storage applications such as the operation settings of the memory cells and the bad block address information to have higher reliability than the normal memory cells MC. Accordingly, even in the case where the normal memory cells MC are capable of storing multi-bit data, it is preferable for the read-only data to be stored as binary data in the read-only memory cells $MC_{ROM}$.

The data erasure will now be described.

The data erasure is performed for, for example, the unit of the block 50 illustrated in FIG. 4. The data erasure of the normal memory cells MC included in the block 50 selected to be erased is performed collectively.

As illustrated in FIG. 6, the intermediate potential Vpass_bg is applied to the back gate BG. The intermediate potential Vpass_bg is a potential that switches the back gate transistor BGT ON and is about, for example, 10 V.

The erasing potential Vera is applied to the bit line BL and the source line SL. The potential VeraG is applied to the drain-side selection gate SGD and the source-side selection gate SGS slightly thereafter. The erasing potential Vera is about, for example, 20 V; and the potential VeraG is lower than the erasing potential Vera by about 10 V.

Thereby, hole currents occurring due to the potential difference between the drain-side selection gate SGD and the bit line BL and the potential difference between the source-side selection gate SGS and the source line SL flow in the channel body 20; and the channel body 20 is boosted to a potential near Vera.

0 V is applied to the electrode layers WL3D, WL2D, WL2S, and WL3S of the normal memory cells MC other than the read-only memory cells $MC_{ROM}$. Thereby, electrons of the charge storage film 32 are removed and holes are injected into the charge storage film 32 due to the potential difference between the channel body 20 and the electrode layers WL3D, WL2D, WL2S, and WL3S; and the data of the memory cells MC is erased.

At this time, the potential difference between the channel body 20 and the electrode layers WL4D, WL1D, WL1S, and WL4S of the read-only memory cells $MC_{ROM}$ is less than the potential difference between the channel body 20 and the electrode layers WL3D, WL2D, WL2S, and WL3S of the normal memory cells MC.

Namely, the intermediate potential Vpass is applied to the electrode layers WL4D, WL1D, WL1S, and WL4S of the read-only memory cells $MC_{ROM}$. The intermediate potential Vpass is greater than 0 V and less than the programming potential Vpgm applied to the electrode layers WL4D, WL1D, WL1S, and WL4S when programming the read-only data to the read-only memory cells $MC_{ROM}$, e.g., about 10 V.

The electrons of the charge storage film 32 are not removed (holes are not injected into the charge storage film 32) for the read-only memory cells $MC_{ROM}$ by the potential difference between the channel body 20 and the electrode layers WL4D, WL1D, WL1S, and WL4S of the read-only memory cells $MC_{ROM}$ at this time. Accordingly, the read-only data stored in the read-only memory cells $MC_{ROM}$ included in the selected block 50 is not erased in the erasing operation of the selected block 50.

Electrons of the charge storage film 32 are not removed and holes are not injected into the charge storage film 32 for the read-only memory cells $MC_{ROM}$ by the intermediate potential Vpass recited above. Accordingly, the threshold voltages of the read-only memory cells $MC_{ROM}$ do not fluctuate in the erasing operation.

The electrode layers of the memory cells MC and the read-only memory cells $MC_{ROM}$ of the unselected block 50 not selected to be erased may be in a floating state. Thereby, the potentials of the electrode layers of the memory cells MC and the read-only memory cells $MC_{ROM}$ increase with the increase of the potential of the channel body 20 described above due to coupling; electrons are not removed from the charge storage films 32 thereof; and the data is not erased.

It is also possible for the electrons of the charge storage film 32 not to be removed and holes not to be injected into the charge storage film 32 for the read-only memory cells $MC_{ROM}$ in the case where the electrode layers of the read-only memory cells $MC_{ROM}$ included in the selected block 50 are floating in the erasing operation of the selected block 50.

However, the erasing and the programming of the data to the read-only memory cells $MC_{ROM}$ can be prevented reliably by the desired intermediate potential Vpass being applied to the electrode layers of the read-only memory cells $MC_{ROM}$.

The intermediate potential Vpass recited above switches the channel body 20 of the read-only memory cells $MC_{ROM}$ to a conducting state. Accordingly, the potential of the entire channel body 20 of the memory string MS including the memory cells MC to be erased can be boosted reliably; and all of the normal memory cells MC connected to the memory string MS can be switched to the erase state collectively.

Data read out of the normal memory cells MC will now be described.

As illustrated in FIG. 6, the BL pre-charge potential Vbl is applied to the bit line BL. The BL pre-charge potential Vbl is, for example, several volts. 0 V is applied to the source line SL. The reading potential Vread_sg is applied to the drain-side selection gate SGD and the source-side selection gate SGS. The reading potential Vread_sg is a potential that switches the drain-side selection transistor STD and the source-side selection transistor STS ON.

The reading potential Vread is applied to the electrode layers WL3D, WL2D, WL2S, and WL3S of the unselected memory cells MC not to be read, the electrode layers WL4D, WL1D, WL4S, and WL1S of the read-only memory cells $MC_{ROM}$, and the back gate BG.

The reading potential Vread does not depend on the charge storing state of the charge storage film 32 and is a potential that switches the memory cells MC, the read-only memory cells $MC_{ROM}$, and the back gate transistor BGT ON.

The read determination potential Vrcg is applied to the electrode layers WL3D, WL2D, WL2S, and WL3S of the selected memory cells MC to be read. The read determination potential Vrcg is, for example, 0 V.

In the case where the program state of the selected memory cells MC to be read is the "1" datum corresponding to the data erase state, the threshold voltage of the memory cells MC is not more than 0 V. Accordingly, the selected memory cells MC to which the read determination potential Vrcg is applied are switched to the on-state. The unselected memory cells MC and the read-only memory cells $MC_{ROM}$ to which the reading potential Vread is applied are in the on-state. Accordingly, the bit line BL and the source line SL conduct; and the voltage of the bit line BL decreases from the BL pre-charge potential Vbl applied thereto.

In the case where the program state of the selected memory cells MC to be read is the "0" datum corresponding to the data program state, electrons are stored in the charge storage films 32 of the memory cells MC; and the threshold voltage is greater than the read determination potential Vrcg (0 V). In such a case, the selected memory cells MC to which the read determination potential Vrcg is applied are in the off-state. Accordingly, the bit line BL and the source line SL are cut off; and the BL pre-charge potential Vbl applied to the bit line BL is maintained.

Accordingly, it can be read whether the selected memory cells MC to be read to which the read determination potential Vrcg is applied are in the "1" datum state or the "0" datum state by whether or not the potential of the bit line BL decreases.

The data read out of the read-only memory cells $MC_{ROM}$ will now be described. For example, the data read out of the read-only memory cell $MC_{ROM}$ having the electrode layer WL4D as the control gate will now be described.

In such a case as well, similarly to the read-out operation of the normal memory cells MC, the BL pre-charge potential Vbl is applied to the bit line BL. 0 V is applied to the source line SL. The reading potential Vread_sg is applied to the drain-side selection gate SGD and the source-side selection gate SGS.

The reading potential Vread is applied to the electrode layers WL1D, WL1S, and WL4S of the read-only memory cells $MC_{ROM}$ not to be read, the electrode layers WL3D, WL2D, WL2S, and WL3S of the memory cells MC, and the back gate BG. The read determination potential Vrcg is applied to the electrode layer WL4D of the read-only memory cell $MC_{ROM}$ to be read.

Accordingly, in the data read-out operation of the read-only memory cell $MC_{ROM}$, it can be read whether the read-only memory cell $MC_{ROM}$ to be read and to which the read determination potential Vrcg is applied is in the "1" datum state or the "0" datum state by whether or not the potential of the bit line BL decreases.

Figure 14:
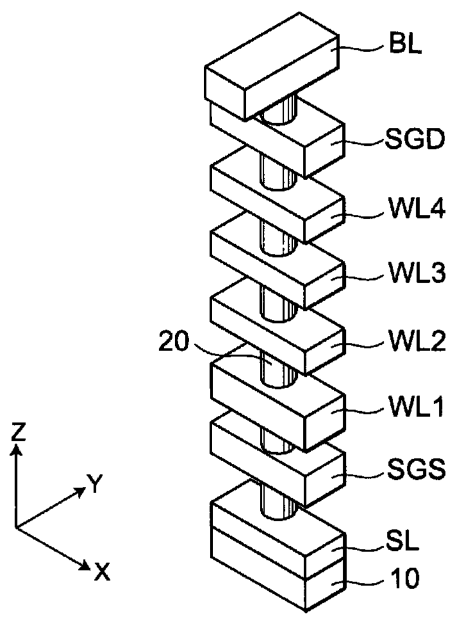
FIG. 14 is a schematic perspective view illustrating another specific example of the memory string of the semiconductor memory device of the embodiment.

The memory string is not limited to a U-shaped configuration; and an I-shaped configuration as illustrated in FIG. 14 may be used. Only the electrically conductive portions are illustrated in FIG. 14, and the insulating portions are not illustrated.

In this structure, the source line SL is provided on the substrate 10; the source-side selection gate (or the lower selection gate) SGS is provided thereon; multiple (e.g., four layers) electrode layers WL1 to WL4 are provided thereon; and the drain-side selection gate (or the upper selection gate) SGD is provided between the bit line BL and the electrode layer WL4 of the uppermost layer.

In such a case as well, at least one selected from the memory cell of the uppermost layer under the drain-side selection gate SGD and the memory cell of the lowermost layer on the source-side selection gate SGS is used as the read-only memory cell $MC_{ROM}$. The read-only data, which is unerasable once programmed, is programmed to the read-only memory cell $MC_{ROM}$; and the erasing operation of this data is prohibited.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method of operating a semiconductor memory device, comprising:

storing read-only data in at least one selected from a memory cell of an uppermost layer and a memory cell of a lowermost layer of a plurality of memory cells connected in series via a channel body, the channel body extending upward from a substrate to intersect a plurality of electrode layers stacked on the substrate; and prohibiting a data erase operation of the read-only memory cell having the read-only data stored in the read-only memory cell, wherein:

a data erase operation of a normal memory cell other than the read-only memory cell is collectively performed for a block unit multiply including a string including a first selection transistor, a second selection transistor, and the plurality of memory cells connected in series, the first selection transistor being provided in one end portion of the channel body, the second selection transistor being provided in one other end portion of the channel body; and a potential difference between the channel body and an electrode layer of the read-only memory cell is less than a potential difference between the channel body and an electrode layer of the normal memory cell in an erasing operation of a block selected to be erased.

2. The method according to claim 1, wherein 0 V is applied to the electrode layer of the normal memory cell and an intermediate potential is applied to the electrode layer of the read-only memory cell in the erasing operation of the block, the intermediate potential being greater than 0 V and less than a programming potential applied to the electrode layer of the read-only memory cell when programming the read-only data to the read-only memory cell.

3. The method according to claim 2, wherein the intermediate potential switches the channel body of the read-only memory cell to a conducting state.

4. The method according to claim 2, wherein a potential of the channel body is boosted to a potential higher than the intermediate potential in the erasing operation of the block.

5. The method according to claim 1, wherein the electrode layer of the normal memory cell and the electrode layer of the read-only memory cell of an unselected block not selected to be erased are in a floating state.

6. The method according to claim 1, wherein an intermediate potential is applied to an electrode layer of the read-only memory cell when programming data to the normal memory cell other than the read-only memory cell, the intermediate potential being less than a programming potential applied to an electrode layer of the normal memory cell.

7. The method according to claim 6, wherein 0 V is applied to the channel body when programming the data to the normal memory cell.

8. The method according to claim 6, wherein the programming potential is applied to the electrode layer of the read-only memory cell and the intermediate potential is applied to the electrode layer of the normal memory cell when programming data to the read-only memory cell.

9. The method according to claim 8, wherein 0 V is applied to the channel body when programming the data to the read-only memory cell.

10. The method according to claim 1, wherein each of the plurality of memory cells includes a charge storage film provided between each of the electrode layers and the channel body.

11. The method according to claim 10, wherein a read determination potential is applied to an electrode layer of a selected memory cell to be read and a reading potential is applied to an electrode layer of an unselected memory cell not to be read when reading data, the read determination potential being configured to switch the selected memory cell ON or OFF according to a charge storing state of the charge storage film, the reading potential being configured to switch the unselected memory cell ON regardless of the charge storing state of the charge storage film.

12. The method according to claim 1, wherein the read-only data includes setting information used to operate the read-only memory cell.

13. The method according to claim 1, wherein the read-only data includes address information of a block including an operationally defective memory cell.

14. The method according to claim 1, wherein the read-only data is stored in the read-only memory cell as binary data.

15. The method according to claim 1, wherein the read-only data is stored in both the memory cell of the uppermost layer and the memory cell of the lowermost layer of the plurality of memory cells.

16. The method according to claim 1, wherein the read-only data is stored in read-only memory cells of the plurality of memory cells of the string, the read-only memory cells having an interposed back gate transistor, the string including a first selection transistor provided in one end portion of the channel body, a second selection transistor provided in one other end portion of the channel body, the back gate transistor, and the plurality of memory cells connected in series, the string including the back gate transistor in an intermediate portion.

* * * * *